(12) United States Patent
Edwards

(10) Patent No.: US 8,779,776 B2
(45) Date of Patent: Jul. 15, 2014

(54) POWER SUPPLY MONITORING SYSTEM

(75) Inventor: Karl Nathan Edwards, East Bentleigh (AU)

(73) Assignee: Jemena Asset Management (6) Pty Ltd, Mount Waverley, Victoria (AU)

(*) Notice: Subject to any disclaimer, the term of this patent is extended or adjusted under 35 U.S.C. 154(b) by 1229 days.

(21) Appl. No.: 12/312,628

(22) PCT Filed: Nov. 23, 2007

(86) PCT No.: PCT/AU2007/001810
§ 371 (c)(1),
(2), (4) Date: Dec. 2, 2009

(87) PCT Pub. No.: WO2008/061321
PCT Pub. Date: May 29, 2008

(65) Prior Publication Data
US 2010/0102826 A1    Apr. 29, 2010

(30) Foreign Application Priority Data

Nov. 24, 2006   (AU) ................... 2006906590

(51) Int. Cl.
| | |
|---|---|
| *G01R 31/02* | (2006.01) |
| *H02H 3/32* | (2006.01) |
| *G01R 31/04* | (2006.01) |
| *H02H 3/38* | (2006.01) |
| *H02H 11/00* | (2006.01) |
| *H01H 83/14* | (2006.01) |
| *H02H 5/10* | (2006.01) |

(52) U.S. Cl.
CPC .......... *G01R 31/021* (2013.01); *H02H 11/005* (2013.01); *H01H 83/14* (2013.01); *H02H 3/32* (2013.01); *H02H 11/002* (2013.01); *H02H 11/001* (2013.01); *G01R 31/041* (2013.01); *H02H 5/105* (2013.01); *H02H 3/38* (2013.01)
USPC .......................................... 324/543

(58) Field of Classification Search
None
See application file for complete search history.

(56) References Cited

U.S. PATENT DOCUMENTS 3,766,435 A * 10/1973 Childers .................. 361/42
4,363,066 A * 12/1982 Bishop ..................... 361/85
(Continued)

FOREIGN PATENT DOCUMENTS

| EP | 0 528 784 A1 | 2/1993 |
| EP | 0 909 956 A2 | 4/1999 |
(Continued)

OTHER PUBLICATIONS

Australian Patent Office International-Type Search Report; Article 15(5); for corresponding Australian National Patent Application No. 2006906590; dated Dec. 20, 2006.
(Continued)

*Primary Examiner* — Paresh Patel
(74) *Attorney, Agent, or Firm* — Christie, Parker & Hale, LLP

(57) ABSTRACT

A method for detecting predetermined fault conditions associated with the supply of AC electrical power to a consumer, the supply having an active conductor and a neutral conductor with the neutral conductor being connected to earth. The method comprises providing a first current detector associated with the active conductor, providing a second current detector associated with the neutral conductor; providing a voltage detector to detect voltage between the active conductor and the neutral conductor, and checking a current ratio of neutral current to active current whereby the current ratio is indicative of a predetermined fault condition. Also disclosed is a method of checking the condition of supply line active and neutral conductors in a consumer's supplied premises including determining the impedance of the active conductor and the impedance of the neutral conductor to indicate the condition of each of the active and neutral conductors.

9 Claims, 6 Drawing Sheets

(56) References Cited

U.S. PATENT DOCUMENTS

| | | | |
|---|---|---|---|
| 4,600,961 A * | 7/1986 | Bishop | 361/76 |
| 4,945,304 A * | 7/1990 | Feron | 324/107 |
| 5,467,012 A | 11/1995 | Nystrom | |
| 5,691,644 A * | 11/1997 | Danilyak | 324/543 |
| 5,706,204 A | 1/1998 | Cox et al. | |
| 6,181,140 B1 * | 1/2001 | Vokey et al. | 324/523 |
| 6,211,682 B1 * | 4/2001 | Liu | 324/502 |
| 6,288,553 B1 * | 9/2001 | Hofstetter et al. | 324/525 |
| 6,654,219 B1 | 11/2003 | Romano et al. | |
| 6,795,285 B1 | 9/2004 | Jozwiak et al. | |
| 7,279,905 B2 * | 10/2007 | Cvorovic | 324/522 |
| 7,298,598 B1 | 11/2007 | Morgan et al. | |
| 7,847,562 B2 * | 12/2010 | Montgomery et al. | 324/542 |
| 7,884,618 B2 * | 2/2011 | Lee | 324/600 |
| 2005/0264383 A1 | 12/2005 | Zhang | |

FOREIGN PATENT DOCUMENTS

| | | |
|---|---|---|
| GB | 2 040 477 A | 8/1980 |
| GB | 2 150 374 A | 6/1985 |
| GB | 2 178 916 A | 6/1986 |
| GB | 2 204 199 A | 11/1988 |
| GB | 2 408 809 A | 6/2005 |
| JP | 55-94164 | 7/1980 |
| JP | 6-194401 | 7/1994 |
| JP | 9-33570 | 2/1997 |
| JP | 11-273538 | 10/1999 |

OTHER PUBLICATIONS

Australian Patent Office International-Type Search Report; Article 15(5); for corresponding Australian National Patent Application No. 2006906590; dated May 2, 2007.

International Search Report, dated Feb. 6, 2008, corresponding to PCT/AU2007/001810.

Written Opinion of the International Searching Authority, dated Feb. 6, 2008, corresponding to PCT/AU2007/001810.

Office action issued on Jan. 28, 2014 in corresponding JP Application No. 2012-265155, including English translation, 5pp.

* cited by examiner

POWER SUPPLY MONITORING SYSTEM

CROSS-REFERENCE TO RELATED APPLICATIONS

This application is a National Phase Patent Application of International Application Number PCT/AU2007/001810, filed on Nov. 23, 2007, which claims priority from Australian Provisional Patent Application No 2006906590 filed on 24 Nov. 2006, the content of which is incorporated herein by reference.

FIELD OF THE INVENTION

This invention relates to an AC power supply monitoring system and relates particularly to a system to monitor fault conditions particularly in domestic, commercial and industrial, single phase power supplies. However, the invention may be adapted for use in monitoring fault conditions in three phase supply. However, for ease of understanding the invention, it will be described with reference to single phase supply systems.

BACKGROUND OF THE INVENTION

Single phase power supply systems throughout Australia and in many parts of the world comprise an active conductor and a neutral conductor which is generally maintained at earth potential by being connected to an earthing system at various points throughout the distribution system, including at a consumer's switch board.

A potential fault situation which sometimes arises and which may be of a major concern to the supply authority and the power user is that of reverse polarity. Reverse polarity may occur through reversing the neutral and active connections at the electricity meter on the premises of the user or at the supply pole from which the service is supplied. With a reverse polarity fault condition, an extremely hazardous situation occurs as dangerous active voltage may be present on the neutral, giving rise to dangerous voltage levels present on the earth system of the user. Many earth systems are connected through water pipes and the like which, in the event of a reverse polarity fault, will give rise to extremely hazardous conditions.

Another fault situation which can create hazardous conditions for the electricity user is that of a neutral failure. If, for example, the neutral wire connecting the user's premises to the power system is accidentally disconnected, such as by a tree or the like cutting the wire, all of the current flow is forced into the user's earth system rather than the neutral connection. This can create the problem of a hazardous voltage on the user's earth, particularly if an earth connection has a higher than expected resistance.

A further potentially hazardous fault situation is a broken or high resistance customer earth system.

At the present time, such fault conditions can only be ascertained by conducting specific fault tests on consumer's premises. Such testing is time consuming and expensive and is, therefore, carried out very infrequently if at all. The faults referred to are not detected by the standard, mechanical electricity meter, or in house Residual Current Device (RCDs).

Accordingly, it is desirable to provide a system which can detect predetermined fault conditions which are present on or arise in a consumer's premises.

It is also desirable to provide a method and system for detecting fault conditions that does not require physical change to be made to a consumer's switchboard or meter board.

It is also desirable to provide a system, and method, to constantly monitor the power supply to a consumer's premises and detect predetermined fault conditions. It is also desirable to provide a method and system which may be adapted to disconnect a supply to a consumer's premises on detection of predetermined fault conditions.

It is also desirable to provide a system and method for detecting predetermined fault conditions associated with the power supply to a consumer's premises which is relatively simply, easy and economic to implement.

SUMMARY OF THE INVENTION

According to one aspect of the invention, there is provided a system for detecting one or more predetermined fault conditions associated with the supply of AC electrical power to a consumer, the supply having an active conductor and a neutral conductor, the neutral conductor being connected to earth, the system comprising:

a first current detector associated with the active conductor;

a second current detector associated with the neutral conductor;

a voltage detector to detect voltage between the active conductor and the neutral conductor; and a contactor switch in the active conductor.

With such a system, a condition such as reverse polarity can be simply and easily detected. With the contactor switch in the active conductor opened, any current detected on the neutral conductor indicates a reverse polarity.

Preferably, a second contactor switch is provided on the neutral conductor to enable the neutral conductor to be disconnected from the supply in the event that a reverse polarity is detected. The contactor switches in either or both of the active and neutral conductors may be controlled by the supply authority. Thus, if current is detected on the neutral connection with the open contactor on the active connection, the supply authority can open the neutral contactor switch.

The system of the invention may also detect other faults such as a broken neutral conductor, a broken customer earth connection, a short circuit between the active and neutral conductor in the low voltage supply line, and a short circuit between the active and the customer's earth.

Thus, for a broken neutral conductor, all incoming current on the active conductor will exit the customer's installation through the customer's earth connection.

Therefore, zero current will exit through the customer's neutral, and the current detector on that neutral conductor will show a zero current flow.

Similarly, a broken customer earth may be detected by measuring the currents on both the active and neutral conductors. During normal polarity, the neutral current will always be less than the current on the active due to a small percentage of the current returning through the customer's earth, which may have a resistance of between 5 and 70 Ohms. Consequently, if the active and neutral currents are identical, this indicates a broken earth, which must then be further investigated.

Other fault conditions may also be detected by the system of the present invention.

According to another aspect of the invention there is provided a method for detecting one or more predetermined fault conditions associated with the supply of AC electrical power to a consumer, the supply having an active conductor and a neutral conductor, the neutral conductor being connected to earth, the method comprising the steps of:

providing a first current detector associated with the active conductor;

providing a second current detector associated with the neutral conductor;

providing a voltage detector to detect voltage between the active conductor and the neutral conductor;

checking a current ratio of neutral current to active current whereby the current ratio is indicative of a predetermined fault condition.

In using the method of the invention, a normal connection without any faults will show a current ratio less than 1 due to the fact that the neutral current will always be less than the current on the active, as indicated above. However, if a reverse polarity connection is present, the current on the neutral will be split between the earth and the active so that the active will have less current than that on the neutral. The ratio, therefore, will be greater than 1. If, as indicated above, a broken neutral is present on the system, all incoming current on the active will exit through the earth and, therefore, zero current will appear on the neutral. Therefore, the current ratio will be zero.

If, with a normal polarity and a broken customer earth, all of the incoming current on the active will exit through the neutral and, therefore, the current ratio will equal 1. Similarly, with reverse polarity, and a broken customer earth, all the incoming current on the neutral will exit through the customer's active so that the ratio will again equal 1.

Where a short circuit is present on the supply service between the active and neutral, the majority of the supply current will return via the neutral line, and a small part will return via the custom's earth. This will force the current on the neutral to flow through the customer's meter in the reverse direction on the neutral. No current will flow through the active line in the customer's meter so that the current ratio will equal minus infinity While the above test will provide a reliable guide as to the existence of the predetermined fault conditions, a further, direct resistance test may also be used to measure the customer's earth resistance and the LV service neutral resistance.

Another test that may be carried out is to check if the supply voltage is within a predetermined acceptable range whereby the consumer is disconnected if the voltage falls below a preset minimum.

Preferably, the method further includes providing a contactor switch in the active conductor to enable remote disconnection of the consumer by the supply authority. A second contactor switch may also by provided in the neutral conductor.

According to a further aspect of the invention, there is provided a method of checking the condition of supply line active and neutral conductors in a consumer's supplied premises comprising the steps of:

measuring a supply voltage across the active and neutral conductors at a predetermined time;

measuring the current in each of the active conductor and neutral conductor at the predetermined time;

measuring the supply voltage and each of the currents in the active and neutral conductors after a switching event, said switching event including adding or removing a load; and determining the impedance of the active conductor and the impedance of the neutral conductor to indicate the condition of each of the active and neutral conductors.

BRIEF DESCRIPTION OF THE DRAWINGS

In order that the invention is more readily understood, embodiments will now be described with reference to the accompanying drawings.

DETAILED DESCRIPTION OF THE PREFERRED EMBODIMENTS

Figure 1:
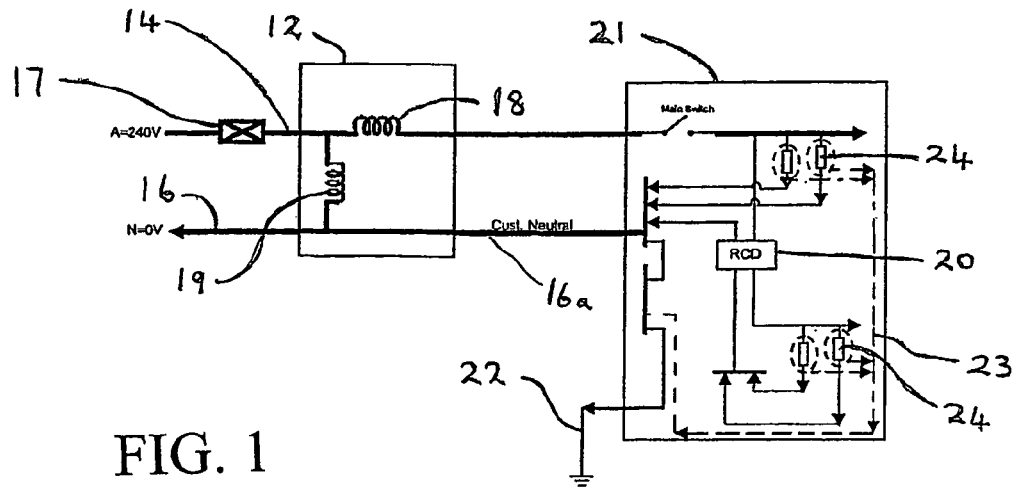
FIG. 1 is a schematic circuit diagram illustrating a normal power supply to a consumer.

Referring to the drawings, existing mechanical electricity meters are unable to detect the integrity of the neutral connection, the customer's earth or a reverse polarity.

However, with the introduction of electronic electricity meters (EEMs), this has become possible. Although it would be possible to completely redesign an electricity meter and switchboard that would be able to detect the described fault conditions, the cost of such changes is unrealistic. Accordingly, embodiments of the present invention have been designed to utilise existing electricity meters and switchboards to obviate or minimise any physical changes.

FIG. 1 illustrates an existing customer's electrical connection to a power supply system. The electricity meter 12 is connected to the active conductor 14 and the neutral conductor 16 extending from the supply authorities distribution system. A service fuse 17, usually located on a telegraph pole or the like external of the consumer's premises, provides primary service protection.

Electricity meter 12 has a low impedance current coil 18 to detect current flow through the meter 12 and a high impedance voltage coil 19 to detect voltage across the active-neutral. Due to the alternating current supply, current flows in both directions through the consumer's switchboard 21 which, generally, incorporates a residual current device (RCD) 20, although not all circuits are so protected. Accordingly, if an earth fault occurs in the consumer's premises, the flow of energy will follow the dotted lines 23 to the earth connection 22.

Figure 2:
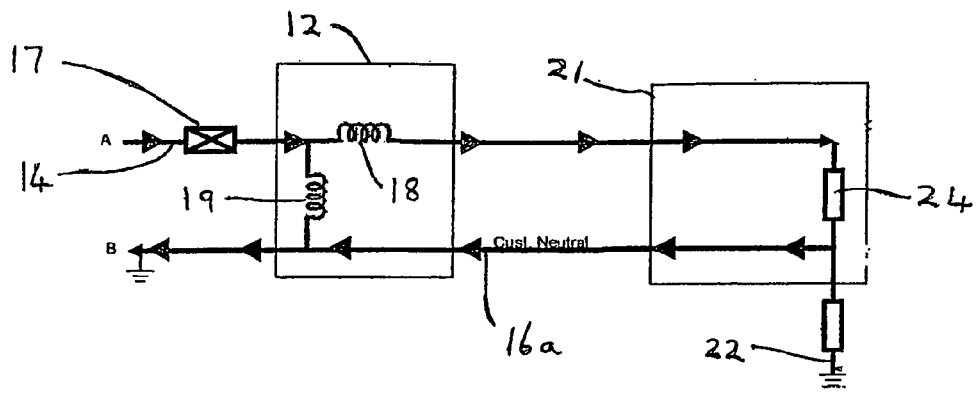
FIG. 2 is a simplified circuit diagram illustrating the normal current flow.

As seen in FIG. 2, in a normal polarity connection, the current flow (during the positive half of the voltage cycle) is in the direction of the arrows. The neutral conductor 16 is connected to earth through the consumer's switchboard 21 as well as externally through the supply network (not shown). Thus, assuming a simple load 24, a supply voltage of 240 volts, the voltage drop across the load is 240 volts, assuming the impedance of the neutral conductor 16 is zero. Nominally, no current will flow through the customer's earth although, in practice, with an earth connection having a resistance typically between 5 Ohm and 70 Ohm, a small current may flow through the earth connection 22.

Of course, during the negative portion of the voltage cycle, the current flows in the reverse direction.

Figure 3:
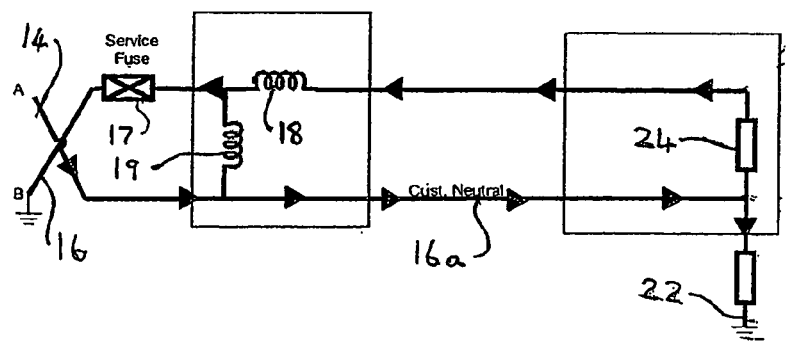
FIG. 3 is a diagrammatic circuit diagram illustrating a reverse polarity connection.

Referring to FIG. 3, a reverse polarity connection is diagrammatically illustrated whereby the active conductor 14 is connected to the customer's neutral conductor 16a. Because the supply authorities neutral conductor 16 is connected to earth at point B, the full supply voltage (240 volts) will be present on the consumer's neutral conductor 16a. Accordingly, the voltage appearing across the load 24 will be 240 volts with current flowing in the direction of the arrows, and, additionally, the voltage across the earth connection 22 will also be 240 volts resulting in a current flow to earth as shown. Such a reverse polarity connection, therefore, potentially introduces 240 volts into the consumer's earth connection 22 giving rise to extremely hazardous and potentially fatal conditions.

Another potentially hazardous fault condition is a broken neutral connection 16 or 16a which forces all load current through the customer's earth rather than the neutral connection. With such a fault, the consumer may not notice any difference in power usage, and the present electricity meters will not detect this fault situation.

The new electronic electricity meters are provided with a second current coil 26 (FIG. 4) on the neutral conductor 16a. The purpose of this current coil is for detection of power theft, and is used to ensure that the current flow on the active conductor 14 is greater than that on the neutral conductor 16. The new meters also include a contactor switch 27 on the active conductor 14. This contactor switch 27 is able to be remotely operated by the power supply company to remotely disconnect supply to a premises in the event that a fault condition is detected, that fraud is detected or the distribution company is required to disconnect the customer.

In accordance with a preferred embodiment of the invention, the electricity meter 12 is provided with a second contactor switch 28 in the neutral conductor 16a. The second contactor switch 28 is preferably remotely operable although it may be a switch which can be actuated on detection of a reverse polarity condition whereby it is necessary to disconnect the supply active from the consumer's neutral conductor 16a.

Figure 4:
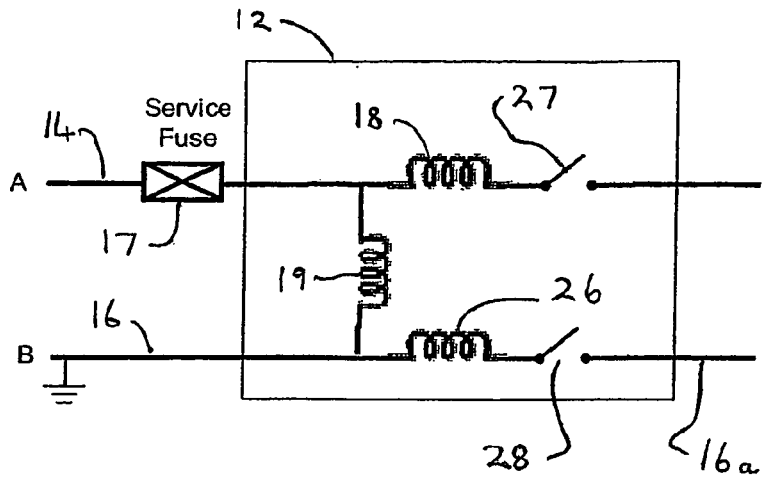
FIG. 4 diagrammatically illustrates features of an electricity meter in accordance with an embodiment of the invention.
Figure 5:
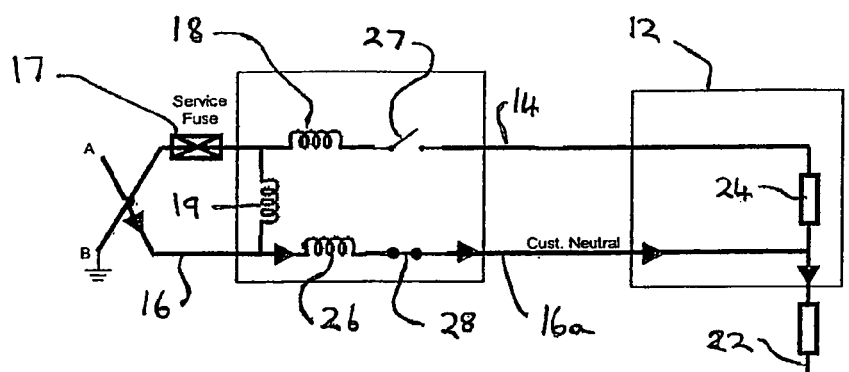
FIG. 5 diagrammatically illustrates a reverse polarity circuit utilising the meter of FIG. 4.

Using the modification shown in FIG. 4, a reverse polarity connection may be detected during an initial "start-up", when a consumer is first connected to the supply. As shown in FIG. 5, the test involves opening the active contactor switch 27 and, using the second current coil 26, checking for the presence of current in the neutral conductor 16a. If current is detected, this indicates a reverse polarity connection and the second contactor switch 28 is immediately opened to disconnect the customer's premises totally from the supply system. Of course, if no current exists through the second current coil 26, then reverse polarity is not present. It will be appreciated that when a reverse polarity condition is present, the power from the supply active flows directly to the consumer's neutral conductor 16a and through the consumer's earth connector 22.

While this method of detecting reverse polarity fault conditions is simple and easy to implement, it does not have the ability to detect the integrity of the neutral conductors 16 and 16a or the customer's earth connector 22. Accordingly, a second method has been devised in order to detect such fault conditions in real time with a live power connection. The method will enable detection of:

reverse polarity;
broken neutral;
broken customer earth;
short circuit between active and neutral conductor in the LV supply (supply authorities side of the connection);
short circuit between active and the earth.

Figure 6:
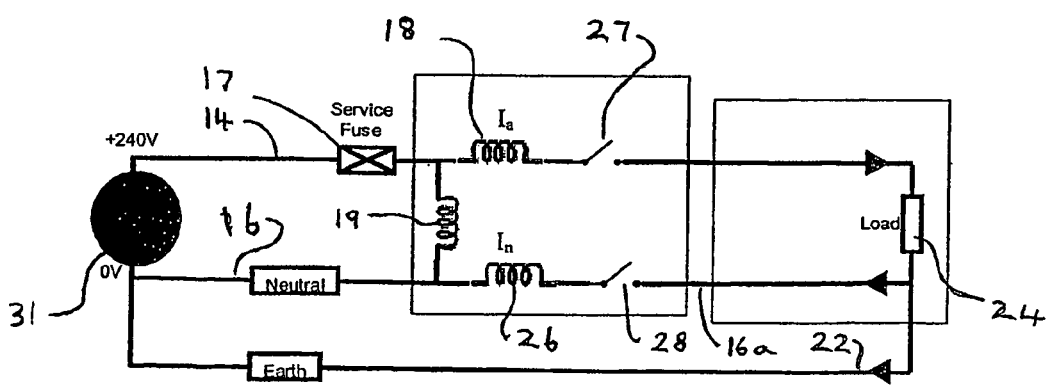
FIG. 6 is a diagrammatic circuit diagram illustrating the described embodiment.

The method involves comparing the ratio of the current on the active conductor 14 with the current on the neutral conductor 16a. As shown in FIG. 6, and noting that circuit behaviour modelled in the following description demonstrates the AC input voltage in its positive cycle, although results are valid for the full cycle AC input, the supply voltage source 31 supplies a nominal 240 volts to the consumer's premises. With both contactor switches 27 and 28 closed, the current flow through the current coils 18 and 26 are measured and compared. During normal polarity, the neutral current will always be less than the current on the active. This is because a small percentage of the current will always return through the customer's earth. Therefore, the current ratio $I_n/I_a$ is less than 1. If a reverse polarity fault condition was present, the incoming current on the neutral conductor 16a will be split between the earth and the active conductor 14. Therefore, the current on the neutral conductor 16a will always be greater than the current on the active conductor 14. Therefore, the ratio $I_n/I_a$ is greater than 1

In the event that a broken neutral condition exists on the system, all incoming current on the active conductor line 14 will exit the customer's installation through the customer's earth 22. Therefore, zero current will exit through the customer's neutral and the current ratio $I_n/I_a$ will equal zero.

With the fault condition of a broken customer earth, with normal polarity connection, all incoming current on the active line 14 will exit through the neutral 16a so that the current ratio $I_n/I_a$ will equal 1.

With a broken custom earth during a reverse polarity fault condition, all the incoming current on the neutral line 16a will exit through the customer's active conductor 14 so that the current ratio $I_n/I_a$ will also equal 1.

Both broken customer earth fault conditions indicated by a current ratio of 1 require immediate investigation, and the customer supply may be disconnected by remote activation by either one or both contactor switches 27 and 28 until the inspection determines and corrects the fault condition. (A visual indicator could also be shown on the meter).

In the event of a fault condition comprising a short circuit between the active conductor 14 and the neutral conductor 16, upstream of the customer meter 12, the majority of the supply current will return through the neutral line 16a, and a small part will return via the customer's earth. This will force the current on the neutral conductor to flow through the customer's meter in the reverse direction on the neutral. No current will flow through the meter's active conductor 14 so that the current ratio will be negative infinity.

In the event of a fault condition comprising a short circuit on the LV service of the supply authority between the active and the earth, upstream of the customer meter 12, the majority of the supply current will return via the neutral line and a small part will return via the customer's earth 22. This will force the current on the neutral to flow through the meter in the positive direction on the neutral, and no current will flow through the meter's active line 14. The current ratio, therefore, will equal infinity.

In accordance with another embodiment of the invention, an advanced current ratio test may be used when, from the behaviour of the circuit, it can be shown that the neutral integrity can be assessed as its resistance approaches 1 Ohm (the maximum allowable resistance). Referring to FIG. 6, it will be seen that as the resistance of the neutral conductor 16a increases from 0 to infinity, the current ratio will reduce from 1 to 0. Therefore, at some point in this range, when the value of neutral resistance is equal to 1 Ohm, a specific ratio could be determined. However, the consumer's earth connection 22 is not a fixed value, and may vary between about 5 Ohm and 70 Ohms. It will be noted that, in order to meet the requirements of the electricity standards, the customer earth resistance should be less than 70 Ohms and the neutral resistance should be less than 1 Ohm. Based on soil conditions, it is hypothesised that the customer's earth resistance is always greater than 5 Ohms.

In order to solve this problem mathematically, Carson's Equations must be used. Carson's Equations model the behaviour of long parallel overhead conductors with a return path through ground. Due to the high reactance of the current travelling through the ground, the majority of the current is forced to return through the neutral line.

Carson's Equations model this situation mathematically.
Simplified Carson's Equations FIG. 7 shows the simplified Carson's Equations diagram.

Figure 7:
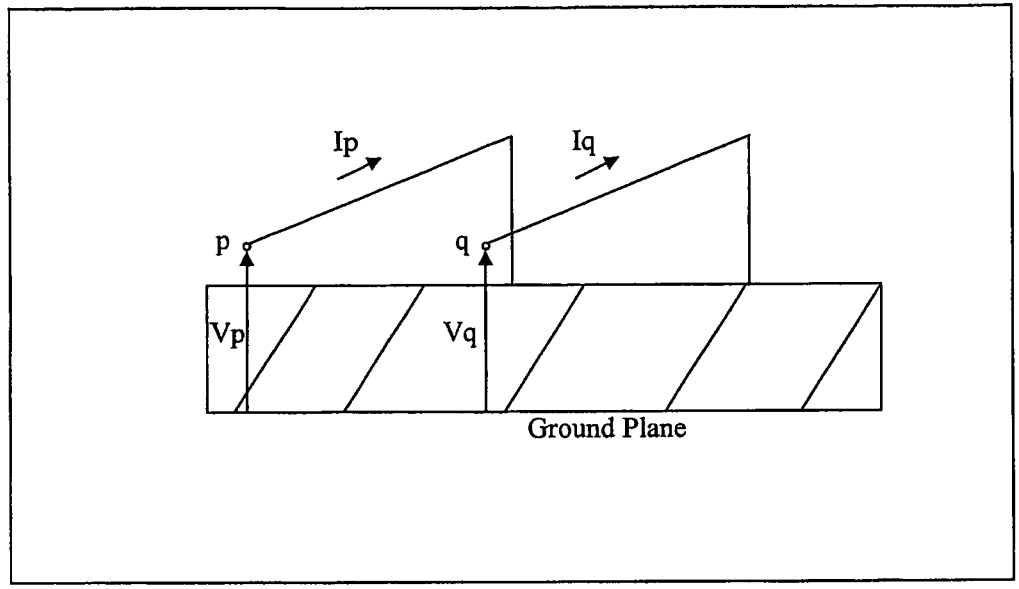
FIG. 7 is a diagram showing a simplified version of Carson's Equations.

Using FIG. 7, Carson's Equations can be used to solve the above parallel lines assuming conductor q is a ground wire.

$$Z_p = r_p + (9.689 \times 10^{-4} \times f) + j\left(4\pi f \times \ln\left(\frac{D_e}{GMR_c}\right)\right) \text{ ohm/km} \quad (1)$$

$$Z_{pq} = (9.689 \times 10^{-4} \times f) + j\left(4\pi f \times \ln\left(\frac{D_e}{D_{pq}}\right)\right) \text{ ohm/km} \quad (2)$$

$$V_p = I_p Z_p + I_q Z_{pq} \quad (3)$$

$$V_q = I_p Z_{pq} + I_q Z_q \quad (4)$$

Let conductor q be a ground wire, in which case $V_q=0$, since both ends of this conductor are connected to ground.

Therefore, we can solve for the ratio $$\frac{I_q}{I_p} \quad (5)$$

$$V_q = I_p Z_{pq} + I_q Z_q$$

$$V_q = 0 \quad (6)$$

$$I_p Z_{pq} = -I_q Z_q \quad (7)$$

$$\frac{I_q}{I_p} = -\frac{Z_{pq}}{Z_q} \quad (8)$$

Equation (8) cannot be used as it does not take into account the grounding resistance that exists within the system. The above example is for a purely theoretical situation. The customer's earth probe has a finite surface area in contact with the ground, therefore creating a finite resistance.

Carson's Equations Modified for Analysis

In order to simulate our system, a ground resistance must be introduced into the system. In order to simplify the equation, the earth resistance at the source has been ignored as it is insignificant in comparison to the customer resistance. This is based on the source earth resistance being CMEN with multiple earths.

Figure 8:
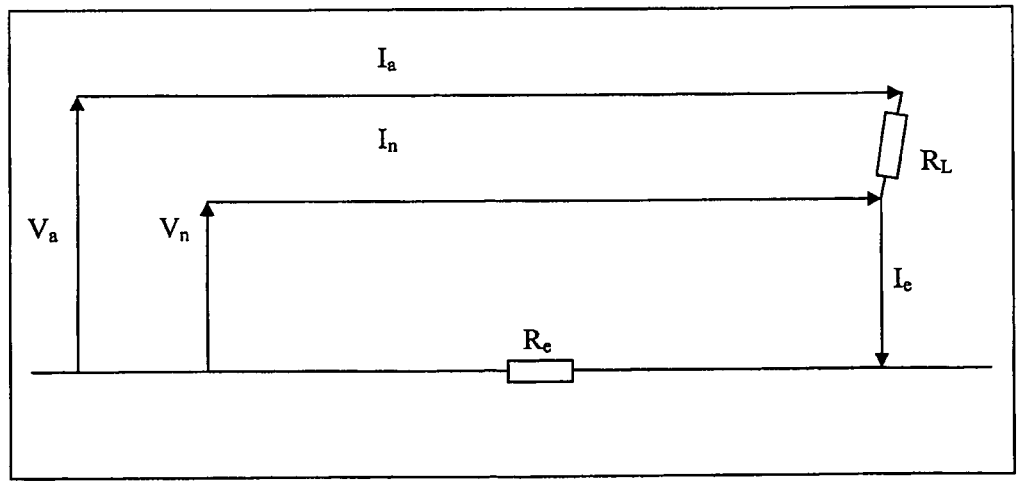
FIG. 8 is a diagram showing a modified version of Carson's Equations.

FIG. 8 has been used to model the scenario.

$$V_a = I_a Z_a + I_n Z_{an} + I_a R_L + I_e R_e \quad (9)$$

$$V_n = I_a Z_{an} + I_n Z_n + I_e R_e \quad (10)$$

$$I_a + I_n = I_e \quad (11)$$

$$V_n = 0 \quad (12)$$

Substituting equations 11 and 12 into equation 10 yields:

$$0 = I_a Z_{an} + I_n Z_n + I_a R_e + I_n R_e \quad (13)$$

$$I_a(Z_{an} + R_e) + I_n(Z_n + R_e) = 0 \quad (14)$$

$$\frac{I_n}{I_e} = -\frac{(Z_{an} + R_e)}{Z_n + R_e} \quad (15)$$

In the circuit diagram of FIG. 6, $I_n$ is defined as flowing in the opposite direction, therefore we can remove the negative symbol.

$$\frac{I_n}{I_a} = \frac{(Z_{an} + R_e)}{(Z_n + R_e)} \quad (16)$$

Given that $$Z_n = r_n + (9.689 \times 10^{-4} \times f) + j\left(4\pi f \times \ln\left(\frac{D_e}{GMR_c}\right)\right) \text{ ohm/km} \quad (17)$$

$$Z_{an} = (9.689 \times 10^{-4} \times f) + j\left(4\pi f \times \ln\left(\frac{D_e}{D_{an}}\right)\right) \text{ ohm/km} \quad (18)$$

$$D_e = 658.37 \times \sqrt{\frac{\rho}{f}} \quad (19)$$

$$GMR_c = 0.7788r \quad (20)$$

Where
$D_e$=Equivalent Depth (metres)
f=frequency (hertz)
$\rho$=Earth Resistivity (Ohm metres)
$GMR_c$=Geometric Mean Radius (metres)
r=radius of conductor (metres)
$r_a$=AC Resistance of neutral conductor
$r_n$=AC Resistance of neutral conductor
$D_{an}$=Distance between conductors a-n (metres)
$R_e$=Customer earth resistance Mathematical Analysis of Circuit The circuit was analysed for varying values of the Neutral Resistance and the Earth Resistance. The Earth Resistance was limited between 5 and 70 Ohms as previously described.

TABLE 1

| | Value | Units | Description |
|---|---|---|---|
| Active Conductor | | | |
| $r_a$ | 0.223 | Ohm/km | AC Resistance of Active conductor |
| $GMR_c$ | 0.00616 | metres | Geometric mean radius of conductor |
| Neutral Conductor | | | |
| $r_n$ | Varied | Ohm/km | AC Resistance of Neutral conductor |
| $GMR_c$ | 0.00616 | metres | Geometric mean radius of conductor |
| Other | | | |
| D(an) | 1.2 | metres | Distance between active & neutral |
| F | 50 | hz | frequency of system |

TABLE 1-continued

| | Value | Units | Description |
|---|---|---|---|
| ρ | 100 | Ohm · Metres | Earth Resistivity |
| D(e) | 931.08 | | Equivalent Depth |

Note:
The conductor used was 19/3.25 AAC, also referred to as Neptune. The LV service conductor was ignored for this analysis.

The largest value of $r_n$ that could be present before the neutral was outside of specifications would be $r_n$=3 Ohms/km. This assumes that the longest circuit length is 333 m.

Figure 9:
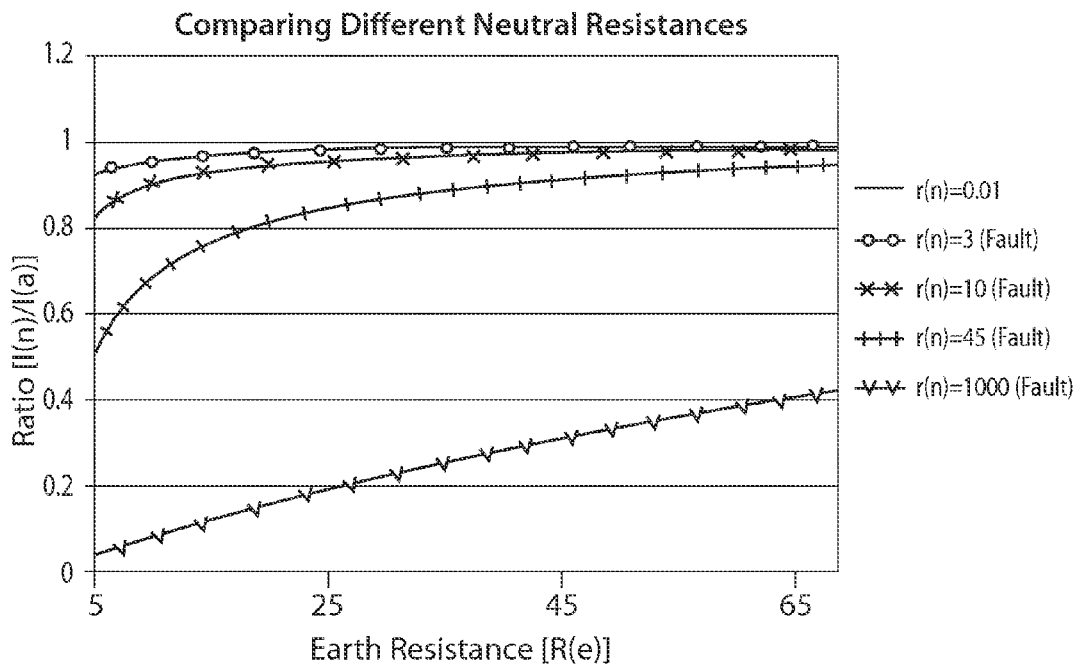
FIGS. 9 and 10 are plots of current ratio against earth resistance for varying values of neutral resistance.
Figure 10:
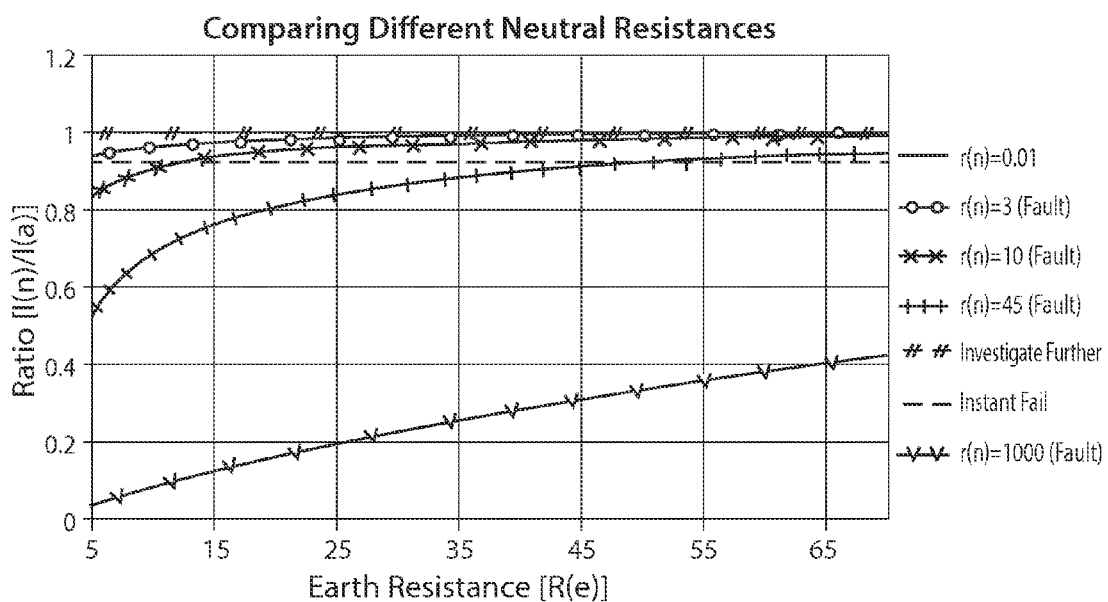
Figure 11:
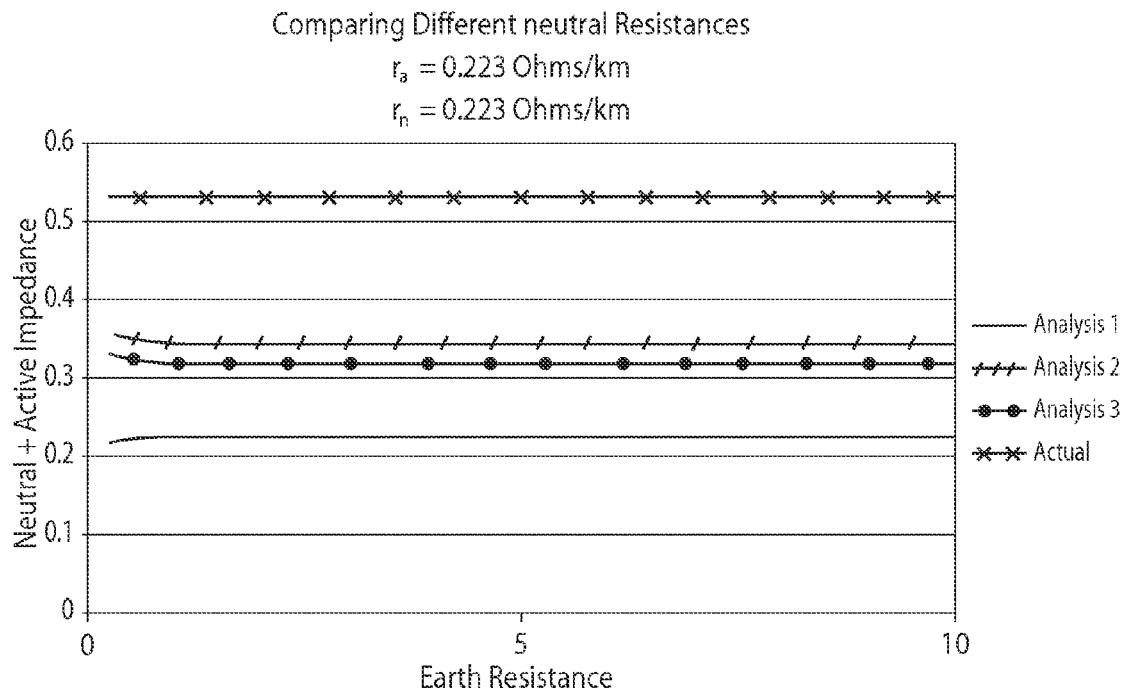
FIGS. 11 to 14 are plots of combined neutral and active impedance against earth resistance for varying values of neutral and active resistance.

When the different values of AC resistances were substituted into the equation, the following results shown in FIG. 9 were obtained.

FIG. 9 shows that:
For low neutral resistances, the ratio approaches 1
For high neutral resistances, the ratio approaches 0
As the earth resistance increases, the ratio increases
The minimum fault condition crosses the y axis at Ratio=0.945

A set ratio cannot be defined to allow for the detection of neutral resistance>1 Ohm. This is because there are two unknown variables, the earth and the neutral resistances.

This method allows the detection of neutral degradation to be analysed at increased accuracy from the previous tests. From the above graph two fixed analysis points can be derived. These are shown on the following graph:

For [0<I Ratio<0.94], Neutral Fail as degraded
For [0.94<I Ratio<1], Inconclusive.

For small values of earth resistance, the detection of neutral degradation is very accurate. As the earth resistance increases, the ability to detect neutral degradation reduces.

Therefore, by applying our previous knowledge we can increase our detection capability, as shown in the table below.

TABLE 2

| Current Ratio | Condition Detected |
|---|---|
| Ratio < 0 | Active/Neutral Short |
| Ratio = 0 | Broken Neutral |
| 0 < Ratio < 0.94 | Neutral Fail as degraded |
| 0.94 < Ratio < 1 | Inconclusive |
| Ratio = 1 | Broken Customer Earth |
| Ratio > 1 | Reverse Polarity |
| Ratio = : | Active/Customer Earth Short |

Note:
The actual ratio ranges are subject to laboratory analysis. This analysis is for mathematical proof of concept only.

A further test must be carried out to investigate the inconclusive ratio tests where 0.94<Ratio<1. This is explained in detail below.

According to a further embodiment of the invention, a further simple resistance test may be performed which minimises possible limitations of current ratio tests.

A potential difficulty with the advance current ratio test is that it may fail to remove the customer's earth resistance as a variable from the ratio equation. The ratio becomes less meaningful as the customer's earth resistance increases and the ability to detect differences between ratio profiles decreases as they all tend towards 1.

The objective of the following test is to analyse the combined impedance of the neutral and active. By analysing the two impedances, the condition of the line can be determined. This test has the ability to ensure that the impedance of the active and neutral lines are within specifications.

For simplicity of explanation a simple analysis to prove the concept has been used. This test requires that the meter 12 store the 'no load voltage' across the meter as a variable within its internal memory. This needs to be completed when there is no current flowing through the meter. At this point the voltage across the meter shall equal the source voltage. This shall be referred to as $V_{ref}$. This voltage can be measured at the meter initialisation, or by disconnecting the active disconnect switch. To ensure accurate results, the reference voltage should be measured instantly before (or after) measuring the meter voltage ($V_m$).

The measured voltage on the meter shall be referred to as $V_m$.

It is known from equations (9) to (20) in the abovementioned section "Carson's Equations modified for analysis":

$$V_a = I_a Z_a + I_n Z_{an} + I_a R_L + I_e R_e \quad (9)$$

$$I_a + I_n = I_e \quad (11)$$

$$\frac{I_n}{I_a} = -\frac{(Z_{an} + R_e)}{(Z_n + R_e)} \quad (15)$$

It is known that:

$$V_a = V_{ref} \quad (21)$$

$$V_m = I_a R_L \quad (22)$$

Analysis 1—Factor $I_a$
Therefore:

$$V_{ref} = I_a Z_a - \frac{(Z_{an} + R_e)}{(Z_n + R_e)} I_a Z_{an} + V_m + (I_a + I_n) R_e \quad (23)\text{-}(27)$$

$$V_{ref} - V_m = I_a Z_a - \frac{(Z_{an} + R_e)}{(Z_n + R_e)} I_a Z_{an} + (I_a + I_n) R_e$$

$$V_{ref} - V_m = I_a Z_a - \frac{(Z_{an} + R_e)}{(Z_n + R_e)} I_a Z_{an} + I_a R_e - \frac{(Z_{an} + R_e)}{(Z_n + R_e)} I_a R_e$$

$$V_{ref} - V_m = I_a Z_a - \frac{(Z_{an} + R_e)(Z_{an} + R_e)}{(Z_n + R_e)} I_a + I_a R_e$$

$$\frac{V_{ref} - V_m}{I_a} = Z_a + R_e - \frac{(Z_{an} + R_e)^2}{(Z_n + R_e)}$$

Figure 12:
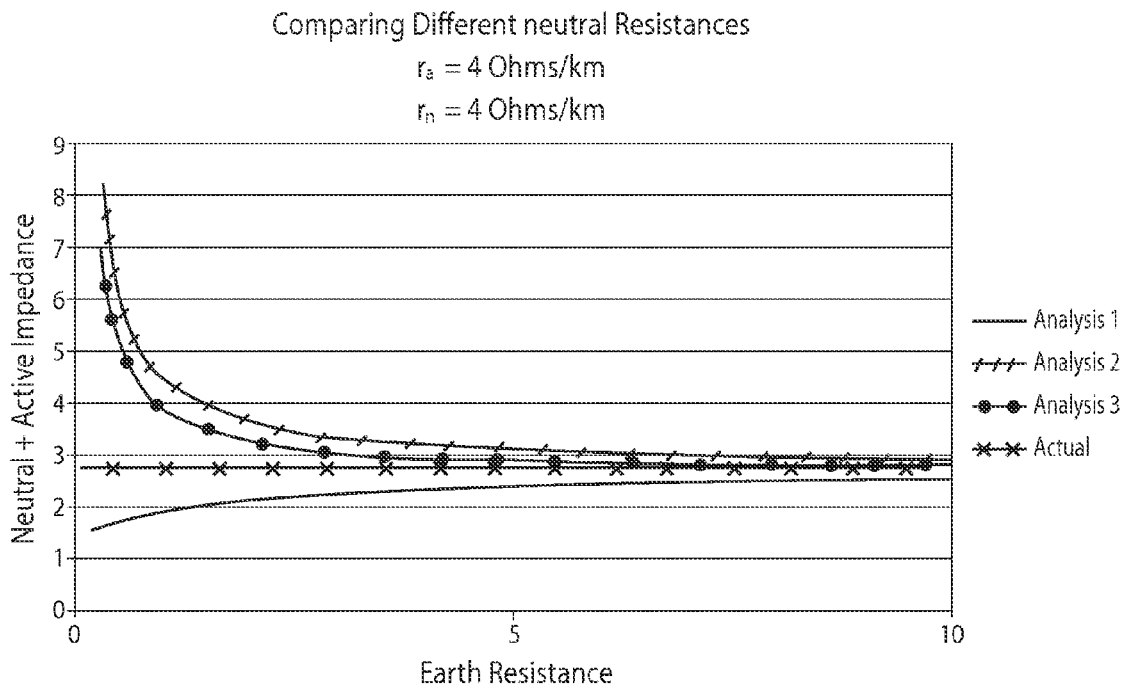
Figure 13:
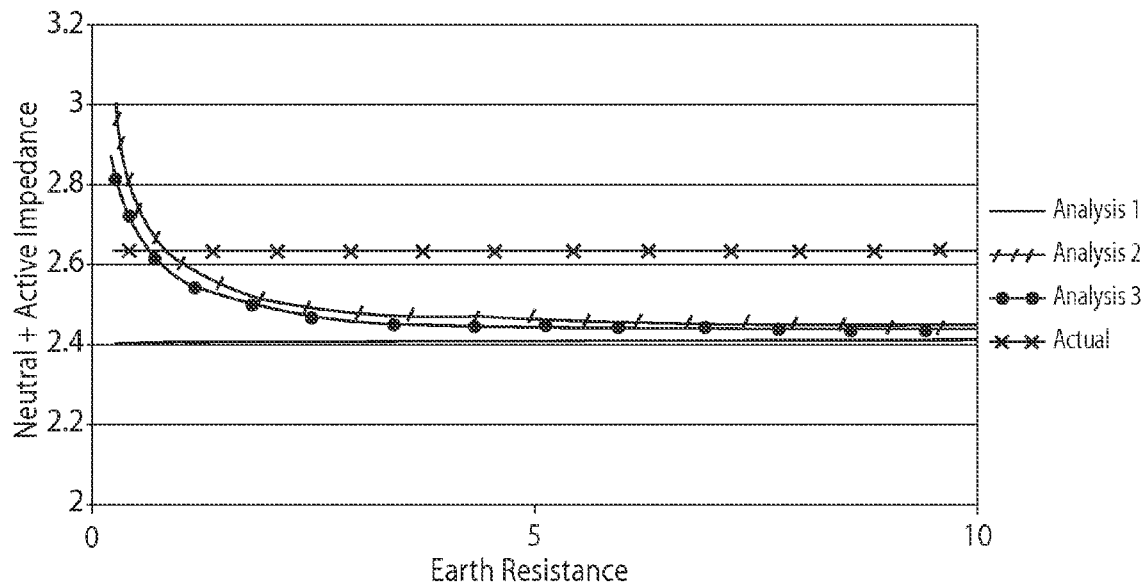
Figure 14:
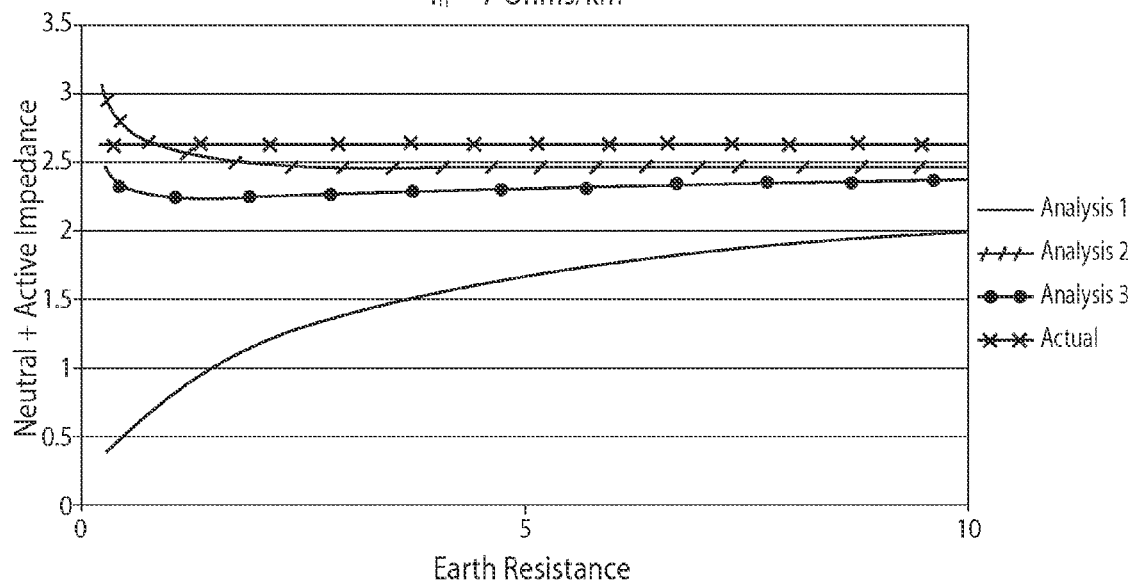

As can be seen from FIG. 12, this analysis will tend to underestimate the value of the combined impedances for small earth resistances. As the earth resistance increases, the accuracy of this analysis will increase.

The major benefit of this methodology is that it does not require a neutral current detector.

Analysis 2—Factor $I_n$
The equations can be rearranged to solve with $I_n$ rather than $I_a$.

$$V_{ref} = I_a Z_a + I_n Z_{an} + V_m + (I_a + I_n) R_e \quad (28)\text{-}(32)$$

$$V_{ref} - V_m = -\frac{(Z_n + R_e)}{(Z_{an} + R_e)} I_n Z_a + I_n Z_{an} + (I_a + I_n) R_e$$

$$V_{ref} - V_m = -\frac{(Z_n + R_e)}{(Z_{an} + R_e)} I_n Z_a + I_n Z_{an} - \frac{(Z_n + R_e)}{(Z_{an} + R_e)} I_n R_e + I_n R_e$$

$$\frac{V_{ref} - V_m}{I_n} = -\frac{(Z_n + R_e)}{(Z_{an} + R_e)} Z_a + Z_{an} - \frac{(Z_n + R_e)}{(Z_{an} + R_e)} R_e + R_e$$

$$\frac{V_{ref} - V_m}{I_n} = Z_{an} + R_e - \frac{(Z_n + R_e)(Z_a + R_e)}{(Z_{an} + R_e)}$$

As can be seen from FIG. 12, this analysis will tend to overestimate the value of the combined impedances for small earth resistances. As the earth resistance increases, the accuracy of this analysis will increase.

Analysis 3—Combination of Factor $I_n$ & $I_a$

As can be seen in FIG. 12, the Analysis 1 has a tendency to underestimate the results for small earth resistances and analysis 2 has a tendency to overestimate the result for small earth resistances. To compensate for these two short falls, the two analysis techniques have been averaged to find the best result.

From these results the upper limit for determining an error shall be when the result is greater than 2 (i.e., the impedance of the neutral plus active is greater than 2 Ohms). As an additional testing technique, the values of this result should be stored within the meter. If the result exceeds a predefined delta change, then the installation should be investigated or disconnected.

$$\text{Result} = \frac{1}{2}(\text{Analysis} \cdot 1) + \frac{1}{2}(\text{Analysis} \cdot 2) \quad (33)\text{-}(37)$$

$$\text{Result} = \frac{1}{2}\left(\frac{V_{ref} - V_m}{I_a}\right) + \frac{1}{2}\left(\frac{V_{ref} - V_m}{I_n}\right)$$

$$\text{Result} = \frac{1}{2}\left(\frac{V_{ref} - V_m}{I_a} + \frac{V_{ref} - V_m}{I_n}\right)$$

$$\text{Result} = \frac{1}{2}\left(\frac{(V_{ref} - V_m)I_n}{I_a I_n} + \frac{(V_{ref} - V_m)I_a}{I_a I_n}\right)$$

$$\text{Result} = \frac{1}{2}\left(\frac{(V_{ref} - V_m)(I_n + I_a)}{I_a I_n}\right)$$

The analysis shown above will calculate the value for the active plus neutral impedance. The analysis of this equation is shown in FIGS. 11 to 14.

For small values of $Z_a$ and $Z_n$, the result from the analysis will tend to underestimate actual values.

Analysis 3 is the preferred method for analysing the condition of the active and neutral, but this test requires a disconnection. This test would generally be completed in the middle of the night as part of a planned test, or following a fault which causes a customer interruption to minimise customer disruptions. The method described hereinafter in relation to an Advanced Resistance Test has the capacity to complete this test without the need for a disconnection.

Advanced Resistance Test

The problem with the method described in relation to the Simple Resistance Test is that a disconnection to the customer is required. However, this test can be optimised to be done without any interruptions to customers, meaning it can be completed in real time, under live conditions.

In the Simple Resistance Test method, it uses the no load conditions to set a reference for which to compare to. However, this is not preferable as it requires the customer to be disconnected. In this Advanced Resistance Test, an alternative is to use the present load on the customer premises as the reference just prior to a switching event. Therefore the conditions just prior to the switching event would be the reference, and the values just after would be the measured values. An example of these switching events are the turning off or on of the following equipment:

| 1. Air conditioner | (~2000 W) |
| 2. Toaster | (~1000 W) |
| 3. Kettle | (~1000 W) |
| 4. Heater | (~1500 W) |
| 5. Light Bulb | (~100 W) |

As the meter has no way of forcing a switching event to occur (unless it is an electric hot water service controlled by the meter), the meter needs to store historical data of the meter voltage and currents. When the switching event occurs (it can be an increase or decrease in load), the meter can use the historical data as a reference. It should be noted that variations to supply voltage and current at the transformer (from other customers) may reduce the accuracy of this test. Therefore it is recommended that a series of results are analysed, rather than a single result.

Therefore, the equations to analyse the line impedances can be written as follows:

$V_m^h$ = Historical meter Voltage     (38)-(41)

$V_m^p$ = Present meter Voltage $I_a^h$ = Historical active current $I_a^p$ = Present active current $I_n^h$ = Historical neutral current $I_n^p$ = Present neutral current $\Delta V_m = V_m^h - V_m^p$ $\Delta I_a = I_a^h - I_a^p$ $\Delta I_n = I_n^h - I_n^p$ $$\text{Result} = \frac{1}{2}\left(\frac{\Delta V_m \cdot (\Delta I_a + \Delta I_n)}{\Delta I_a \cdot \Delta I_n}\right)$$

With the introduction of this testing methodology, the contactor switch 27 on the active conductor 14 is not required to determine the resistance of the active and neutral conductors, nor to detect reverse polarity.

In addition, if it was acceptable to reduce the accuracy of the testing slightly, then the neutral detection coil 26 would not be required to detect the resistance of the active and neutral conductors. However, if this coil 26 were removed, then reverse polarity could not be detected. The equation (42) shown below demonstrates how the approximate resistance of the active and neutral conductors can be calculated by only using $V_m$ and $I_a$. This is an alteration to the equations (23) to (27).

$$\text{Result} = \frac{\Delta V_m}{\Delta I_a} \quad (42)$$

A final test should check if the supply voltage is within the electricity distribution code. If the voltage across the source falls outside this range, then the premise may need to be disconnected from supply.

As the SIR's allow for a 10% voltage drop within the customer's installation, this shall be used to provide the minimum allowable voltage before the customer is disconnected.

$$V = 216 - 10\%$$
$$= 196\ V$$

Therefore, once the voltage across the electricity meter reads less than 196V, the customer should be disconnected or the utility notified of a possible fault.

The described embodiments of this invention have many benefits, some of which are:
   Increased Safety:
      Avoid fatalities and electric shocks caused by reverse polarity
      Avoid fatalities and electric shocks caused by deteriorated neutral connections
      Avoid fatalities and electric shocks caused by deteriorated customer earths
   Reduced costs:
      Avoid NST testing the entire population of LV services every 10 years
      Schedule replacement of LV services prior to failure, therefore reducing the replacement costs.
   Improve reliability:
      Schedule replacement of LV services prior to failure, therefore avoiding customer outages in fault conditions.
   Improved Image:
      Highlights electricity distributors as being proactive
      Improves relations between regulators and distributors
      Improved customer satisfaction.

It will be seen that it is theoretically possible to analyse the integrity of the neutral connection and the customer's earth within the requirements of the electricity distribution code. In addition it is possible to detect the presence of a reverse polarity condition. If the meter detects any of the above conditions, it can then safely disconnect the customer premises from supply via the output contactors within the electricity meter.

The techniques involved do not rely on the electricity meter for detection of these events as the capability could be built into its own separate device. However, it is recognised that as the electricity meter already contains many of the components, it is appropriate to use the existing electronic meter and add the additional switching or other functionality required in addition to the required logic within the device.

From the above detailed analysis, shown below is a summary of the analysis techniques.

TABLE 3

| When | Test | Result | Condition Detected |
| --- | --- | --- | --- |
| Initialisation | Initialisation Test | Current > 0 | Reverse Polarity |
| Real-Time | Low Voltage | Voltage < 196 V | Active or Neutral or Earth Failure |

TABLE 4

| When | Advanced Resistance Test | Current Ratio Test | Condition Detected |
| --- | --- | --- | --- |
| Real-Time | NA | Ratio < 0 | Active/Neutral Short |
| Real-Time | NA | Ratio = 0 | Broken Neutral |
| Real-Time | >2 | 0 < Ratio < 0.94 | Neutral Fail as degraded |
| Real-Time | NA | Ratio = 1 | [1]Broken Customer Earth |
| Real-Time | NA | Ratio > 1 | [2]Reverse Polarity (or illegal Cust. Connection) |
| Real-Time | NA | Ratio = : | Active/Customer Short |
| Real-Time | >2 | 0.94 [Ratio < 1 | Active Fail as degraded |
| Real-Time | <2 | 0.94 [Ratio < 1 | System Normal |

Note
[1]This result may be produced by the lack of sensitivity in measuring equipment.
Note
[2]A value of 1.1 will avoid any false tripping from equipment inaccuracy.

It will be appreciated that it is not ideal to cause a customer to experience multiple momentary interruptions for Direct Resistance testing. Therefore it may be necessary to store the last test date, and the resistance ratio results. This can then be used for future analysis.

The electricity meter may need to have an override to avoid performing tests in certain locations. An alternative option is to be able to reduce/increase the detection limits. Further, there are a lot of small variations that can be done to increase detection performance and avoid unnecessary disconnection. Also, the current/voltage detection coil may not be sensitive enough for the requirements of this testing methodology. Additionally, the contactor switch on the neutral needs to be capable of isolating under full fault loading.

The invention claimed is:

1. A method of checking a condition of active and neutral or earth conductors to and from a consumer's premises, the neutral or earth conductor being connected to earth, the method comprising:
   measuring a current in the active conductor at a predetermined time;
   measuring a voltage across the active conductor and the neutral or earth conductor at said predetermined time;
   measuring a current in the active conductor after a switching event;
   measuring a voltage across the active and neutral or earth conductors after the switching event;
   determining an impedance of the active conductor and an impedance of the neutral or earth conductor at the consumer's premises using the voltage measured at the predetermined time and after the switching event; and
   using values of the determined impedances to indicate a condition of the active and neutral or earth conductors.

2. A method according to claim 1, wherein the determination of the impedances comprises using the ratio of:
   the difference between the voltage measured at the predetermined time and after the switching event, and
   the difference between the current measured at the predetermined time and after the switching event.

3. A method according to claim 1, wherein the switching event is an adding or a removing of a load.

4. A method according to claim 1, wherein the switching event is a switching on or off of an appliance within the consumer premises.

5. A method according to claim 1, wherein using a value of the determined impedances to indicate the condition of each of the active and neutral or earth conductors includes:

using the value of the determined impedances to be greater than a threshold to indicate 'Neutral fail as degraded';

using the value of the determined loop impedance to be greater than a threshold to indicate 'Active fail as degraded'; and using the value of the determined loop impedance to be less than a threshold to indicate 'System Normal'.

6. A method according to claim 1, further comprising measuring a neutral current at the predetermined time and after the switching event.

7. A method according to claim 1, further comprising storing historical data of the voltage, an active current and a neutral current.

8. A method according to claim 1, wherein the consumer's premises remain under live conditions between measuring the current and the voltage at the predetermined time and measuring the current and the voltage after the switching event.

9. A method according to claim 1 that is performed in real time.

\* \* \* \* \*